United States Patent
Seddon et al.

(10) Patent No.: US 7,785,456 B2
(45) Date of Patent: Aug. 31, 2010

(54) MAGNETIC LATCH FOR A VAPOUR DEPOSITION SYSTEM

(75) Inventors: Richard I. Seddon, Santa Rosa, CA (US); Markus K. Tilsch, Santa Rosa, CA (US); Jeremy Hayes, Santa Rosa, CA (US)

(73) Assignee: JDS Uniphase Corporation, Milpitas, CA (US)

(*) Notice: Subject to any disclaimer, the term of this patent is extended or adjusted under 35 U.S.C. 154(b) by 1028 days.

(21) Appl. No.: 10/968,642

(22) Filed: Oct. 19, 2004

(65) Prior Publication Data

US 2006/0081468 A1 Apr. 20, 2006

(51) Int. Cl.
*C25B 9/00* (2006.01)
*C25B 11/00* (2006.01)
*C25B 13/00* (2006.01)
*C23C 16/00* (2006.01)
*C23C 14/00* (2006.01)

(52) U.S. Cl. ............ 204/298.27; 204/298.15; 204/298.23; 118/728; 118/729; 118/730

(58) Field of Classification Search ............ 118/503, 118/730, 728, 729; 204/192.1, 192.15, 298.15, 204/298.23, 298.27; 475/11
See application file for complete search history.

(56) References Cited

U.S. PATENT DOCUMENTS

| | | | | |
|---|---|---|---|---|
| 3,616,452 A | | 10/1971 | Bessot et al. ............ 204/298.06 |
| 3,858,547 A | * | 1/1975 | Bergfelt ....................... 118/730 |
| 4,002,141 A | * | 1/1977 | Shrader ....................... 118/730 |
| 4,034,704 A | * | 7/1977 | Wossner et al. ............. 118/730 |
| 4,250,009 A | | 2/1981 | Cuomo et al. ........... 204/192.11 |
| 4,485,759 A | * | 12/1984 | Brandolf ..................... 118/503 |
| 4,960,485 A | | 10/1990 | Ichinose et al. ............. 156/556 |
| 5,106,346 A | | 4/1992 | Locher et al. ................. 475/11 |
| 5,232,569 A | * | 8/1993 | Nelson et al. ........... 204/192.15 |
| 5,710,407 A | | 1/1998 | Moore et al. ................ 219/405 |
| 5,795,448 A | | 8/1998 | Hurwitt et al. ............ 204/192.1 |

(Continued)

FOREIGN PATENT DOCUMENTS

EP 1139393 10/2001

(Continued)

OTHER PUBLICATIONS

Merriam-Webster Online Dictionary: http://www.merriam-webster.com/dictionary/armature [Accessed on Oct. 28, 2009].*

(Continued)

*Primary Examiner*—Alexa D Neckel
*Assistant Examiner*—Michael Band
(74) *Attorney, Agent, or Firm*—Matthew A. Pequignot; Pequignot + Myers LLC

(57) ABSTRACT

The invention relates to a magnetic latch for securing substrates on a planetary rotating platform suspended above a coating source in a vacuum chamber of a vapor deposition system, e.g. a chemical vapor deposition (CVD) system or a physical vapor deposition (PVD) system. The magnetic latch includes a permanent magnetic, which is moveable between a latching position, in which the permanent magnet magnetizes the latch for attracting a substrate holder, and an unlatching position, in which the permanent magnet is connected in a bypass circuit, thereby demagnetizing the latch for releasing the substrate holder.

10 Claims, 9 Drawing Sheets

U.S. PATENT DOCUMENTS

| | | | |
|---|---|---|---|
| 5,820,329 A | 10/1998 | Derbinski et al. | 414/225.01 |
| 6,464,825 B1 | 10/2002 | Shinozaki | 156/345.55 |
| 6,800,833 B2 | 10/2004 | Gregor et al. | 219/390 |
| 6,844,274 B2 | 1/2005 | Yoshioka et al. | 438/800 |
| 2005/0014368 A1 | 1/2005 | Yoshioka et al. | 438/689 |
| 2005/0189228 A1 | 9/2005 | Huang | 205/157 |

FOREIGN PATENT DOCUMENTS

| | | |
|---|---|---|
| JP | 61010239 | 1/1986 |
| RU | 2008501 | 2/1994 |
| WO | 02/19379 | 3/2002 |
| WO | 03/034419 | 4/2003 |

OTHER PUBLICATIONS

European Search Report, European Published Patent Application No. 1903603, Aug. 6, 2009.

* cited by examiner

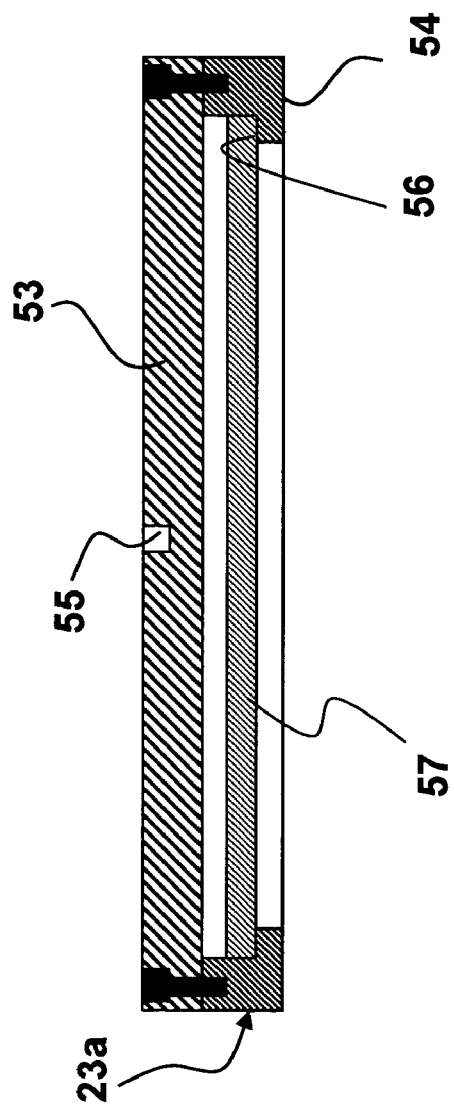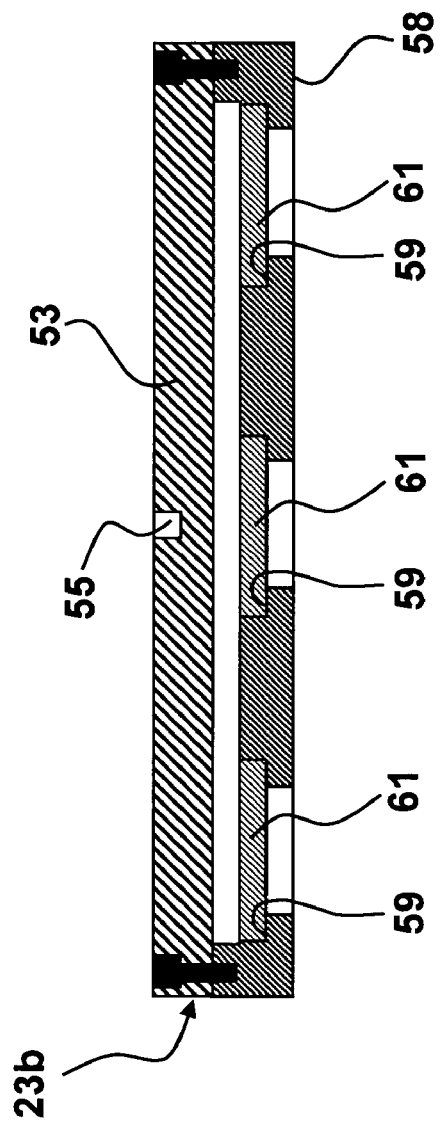

MAGNETIC LATCH FOR A VAPOUR DEPOSITION SYSTEM

CROSS-REFERENCE TO RELATED APPLICATIONS

The present invention does not claim priority.

TECHNICAL FIELD

The present invention relates to a magnetic latch for use in a vapor deposition system, and in particular to a soft engaging magnetic latch for suspending a substrate holder in a vacuum chamber of a physical vapor deposition (PVD) system or a chemical vapor deposition (CVD) system.

BACKGROUND OF THE INVENTION

The coating flux from a source in a PVD or a CVD system are relatively stable; however, they have a spatial distribution that can lead to deposited films with non-uniform thickness, if the substrates remain stationary. To improve uniformity, the geometrical relationship between the source and substrate must be selected appropriately. Good results have been observed when the substrate is rotated about an axis perpendicular to the plane of the surface to be coated, and in particular when multiple substrates have been mounted on multiple spindles in a planetary configuration.

Conventional planetary gear coating systems, such as the one disclosed in U.S. Pat. No. 5,106,346, issued Apr. 21, 1992 to Stefan Locher et al, includes a large rotating platform with several individual spindles (planets) rotatable thereon disposed within a sealed vacuum chamber. Unfortunately, each substrate holder must be connected to a mounting flange on each spindle using mechanical fasteners, e.g. bolts, requiring manual replacement. Not only do these mechanical systems require extra manual labor, they are more susceptible to misalignment caused by changes in temperature and pressure.

In order to isolate as much of the bearing and gear structure as possible from the vacuum chamber, Hurwitt et al disclosed a planetary gear coating system in U.S. Pat. No. 5,795,448 issued Aug. 18, 1998, which includes a magnetic link in the shaft of each spindle. The substrate holders are not suspended over the cathodes, and still require mechanical fasteners for attachment to the mounting flanges of the spindles.

The coating system, disclosed in U.S. Pat. No. 6,464,825 issued Oct. 15, 2002 to Shinozaki, includes a robotic arm traveling between a pressurized loading/unloading chamber and the main vacuum chamber to minimize the amount dust entering the main vacuum chamber. The Shinozaki system also includes a magnetic rotational drive and a magnetic levitating member to minimize particulate generation caused by interacting mechanical elements. However, Shinozaki discloses a single rotating platform with a complicated levitating platform and electro-magnets that totally surround the substrate holder. Unfortunately, this approach would be impossible to implement in a planetary gear coating system, as it is very difficult to deliver power separately to individual rotating substrate holders in a planetary system, while operating in a vacuum and at elevated temperatures.

An object of the present invention is to overcome the shortcomings of the prior art by providing a magnetic latch for attaching a substrate holder to a spindle suspended over a cathode in a planetary coating system without shock to the substrate and without generation of particulate matter.

SUMMARY OF THE INVENTION

Accordingly, the present invention relates to a planetary substrate support of the type for mounting in a process chamber of a coating system, which is for coating substrates mounted on substrate holders, comprising:
a main support rotatable about a first axis;
a plurality of spindles extending from the main support rotatable about respective spindle axes; and
a magnetic latch on an end of each spindle including a permanent magnet, and a mounting surface for receiving a substrate holder;
wherein each magnetic latch includes a first section, and a second section movable relative to the first section between a first position in which the permanent magnet magnetizes the mounting surface for attracting a substrate holder, and a second position in which the mounting surface is non-magnetic.

Another aspect of the invention relates to a coating system for coating substrates mounted on substrate holders comprising:
a process chamber;
a coating source disposed in the process chamber for depositing a coating on the substrate; and
a planetary substrate support mounted in the process chamber.

The planetary substrate support including:
a main support rotatable about a first axis;
at least one spindle extending from the main support rotatable about respective spindle axes; and
a magnetic latch on each spindle for receiving the substrate holder;

Each magnetic latch comprising:
a first section including a mounting surface for receiving the substrate holder, and
a second section including a permanent magnet, one of the first or the second sections movable relative to the other section between a first position in which the mounting surface forms a temporary magnet for attracting a substrate holder, and a second position in which the mounting surface is non-magnetic.

BRIEF DESCRIPTION OF THE DRAWINGS

The invention will be described in greater detail with reference to the accompanying drawings which represent preferred embodiments thereof, wherein:

FIG. 6b is a cross sectional view of the stator of FIG. 6a;

FIGS. 8a to 8d are schematic illustrations of substrate holders according to the present invention.

DETAILED DESCRIPTION

Figure 1:
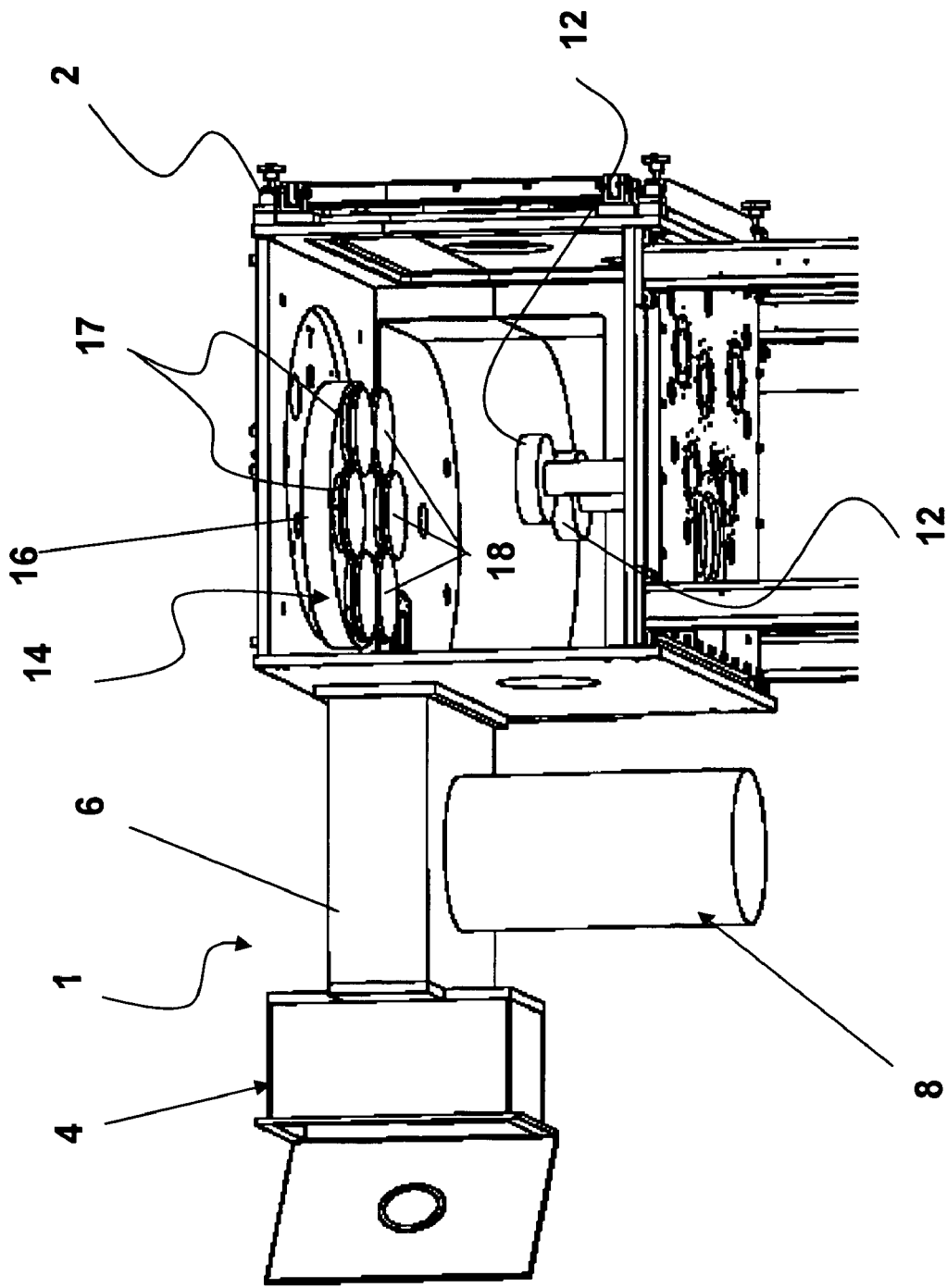
FIG. 1 is an isometric view of the coating system according to the present invention.
Figure 2:
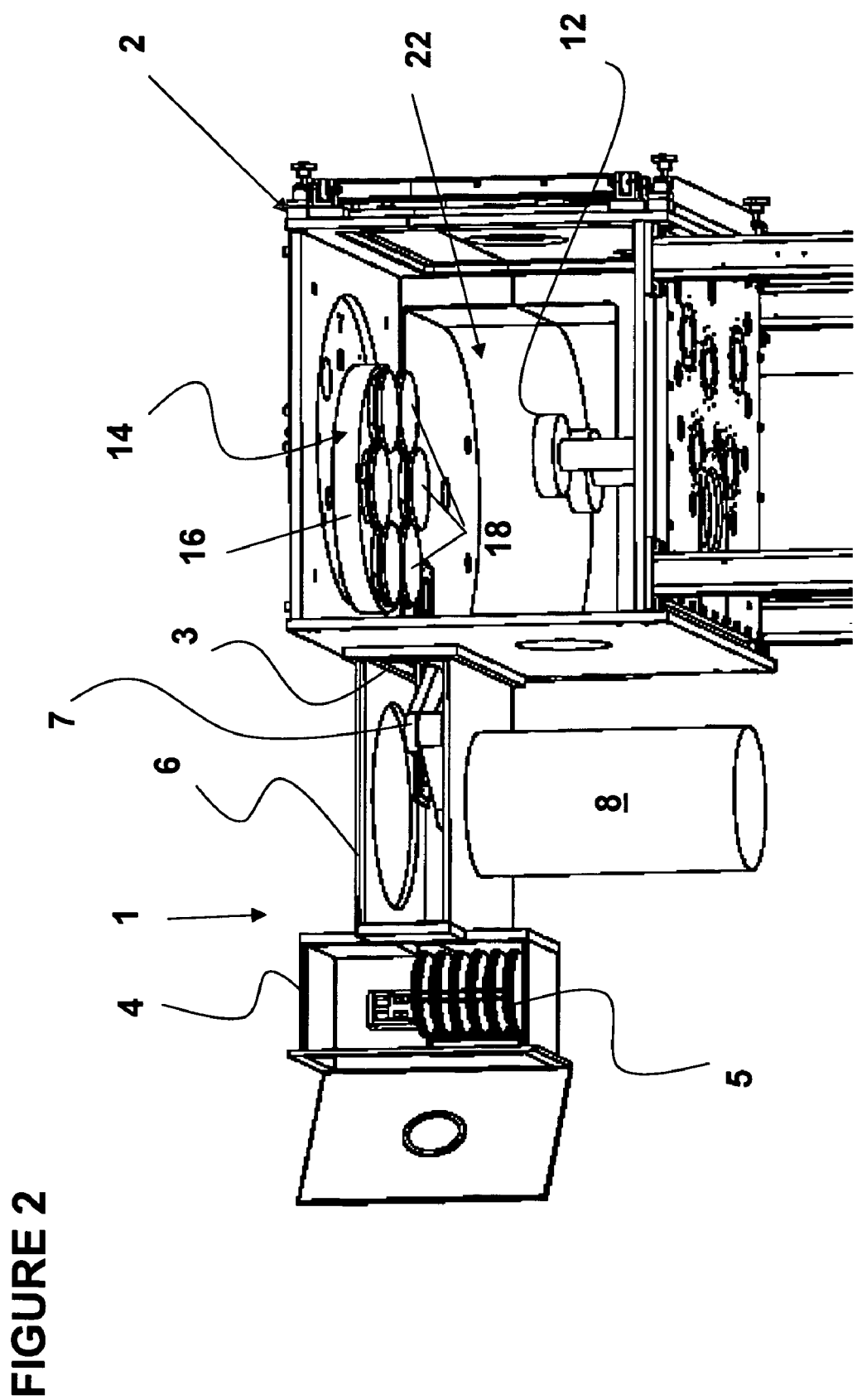
FIG. 2 is an isometric view of the coating system of FIG. 1 with some outer wall removed.
Figure 3:
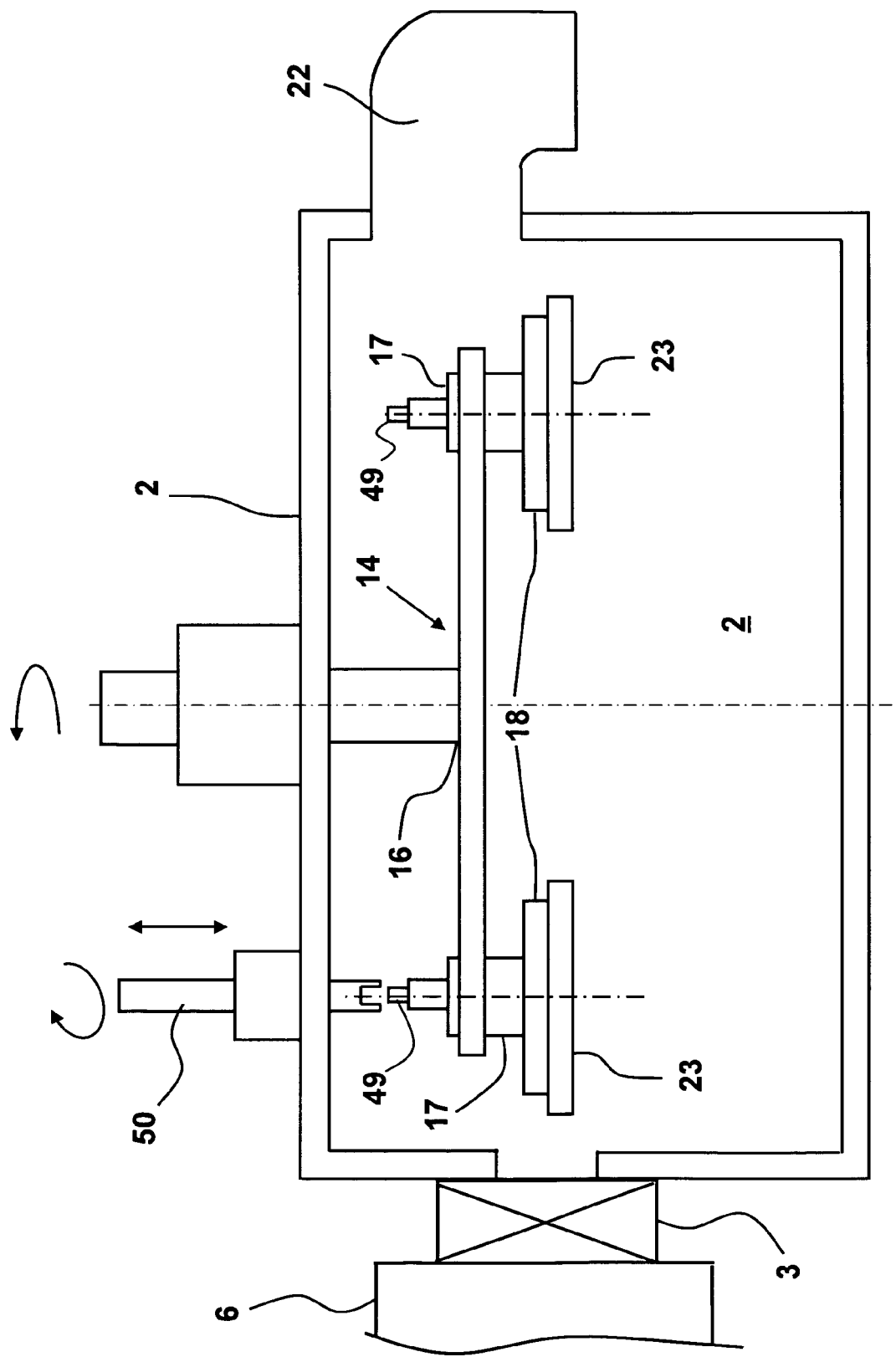
FIG. 3 is a schematic illustration of a planetary substrate holder with a magnetic latch according to the present invention.

With reference to FIGS. 1 to 3, the vapor deposition vacuum system, e.g. Physical Vapor Deposition (PVD) or Chemical Vapor Deposition (CVD), according to the present invention includes a load lock chamber, generally indicated at 1, and a process chamber 2 with a gate valve 3 therebetween. The gate valve 3 enables the pressure in the load lock chamber 1 to be brought to atmospheric pressure for loading and unloading of substrates or to be re-established to the pressure of the process chamber 2 for substrate transfer, independently of the pressure in the process chamber 2. The load lock chamber 1 includes a loading container 4 with a cassette elevator 5 therein, and a transfer channel 6 with a robotic arm 7 therein. The control mechanism for the robotic arm 7 is mounted in the cylindrical canister 8 extending from the transfer channel 6.

A cathode 12, and a planetary substrate support 14 are mounted within the process chamber 2. The planetary substrate support 14 comprises a main cylindrical platform 16 rotatable about a first axis, with a plurality of, e.g. six, spindles 17 extending therefrom, each spindle 17 rotatable about its own axis, which are preferably parallel to the first axis, but may be at some other angle. In use, as the main platform 16 is rotated, each individual spindle 17 is also rotated to ensure even coating over all portions of each substrate. Each spindle 17 includes a magnetic latch 18 at the outer free end thereof for suspending a substrate over the cathode 12, which will be further described hereinafter At least one cathode 12, preferably low arcing cathodes, are mounted inside the process chamber 2. Extra cathodes 12 may be provided for backup in case of failure or in case the coating supply in one cathode 12 becomes exhausted. Alternatively, several different cathodes 12 can be provided to enable the deposition of different coatings consecutively without opening up the process chamber 2 to the atmosphere. Preferably, minor adjustments can be made to the position of the cathode 12 by movement a mounting platform (not shown), manually or by remote control.

The process chamber 2 is evacuated through pumping port 22, while process gases are supplied to the process chamber 2 via mass flow controllers (not shown).

While sputter deposition vacuum systems have been described herein, the planetary substrate support according to the present invention can be utilized with any other suitable coating system such as evaporative systems or CVD systems. The coating process can be enhanced by additional equipment such as shutters, masks, ion bombardment devices, advanced anode concepts, or plasma activation systems.

While the coating system is shown in a sputter up configuration herein, magnetic latch according to the present invention can be utilized in other orientations such as coating down and coating sideways.

Uncoated substrates mounted in substrate holders 23 are loaded onto the cassette elevator 5 with the gate valve 3 closed, thereby maintaining the pressure in the process chamber 2. When the load lock chamber 1 is evacuated, the gate valve to the process chamber 2 opens and the robotic arm 7 transfers each substrate holder 23 through the transfer channel 6 and the open valve gate 3 to the process chamber 2 for mounting onto the spindles 17 with the help of the magnetic latches 18.

Figure 4:
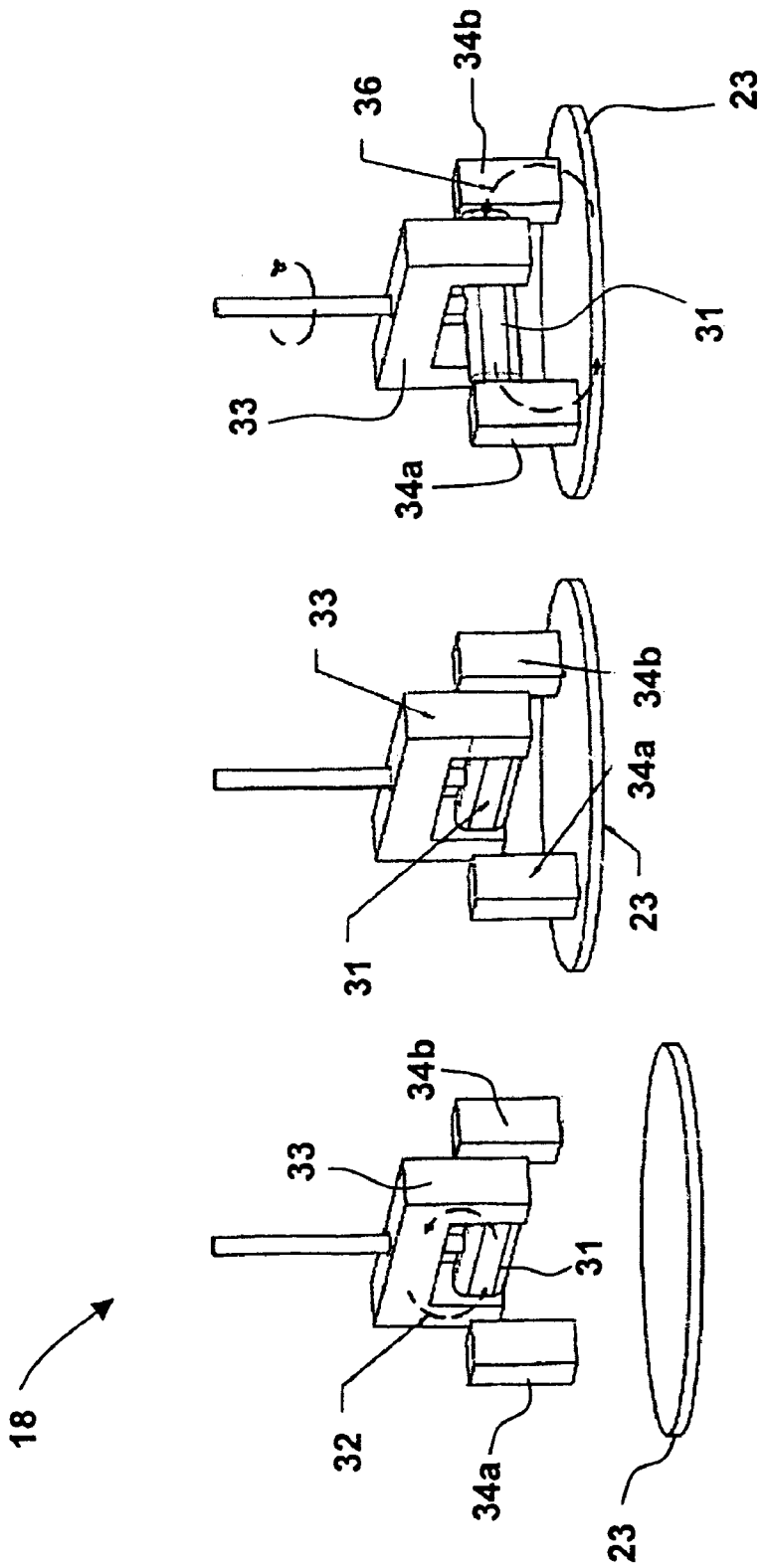
FIGS. 4a to 4c are schematic illustrations of the basic principle of the magnetic latch according to the present invention.
Figure 5:
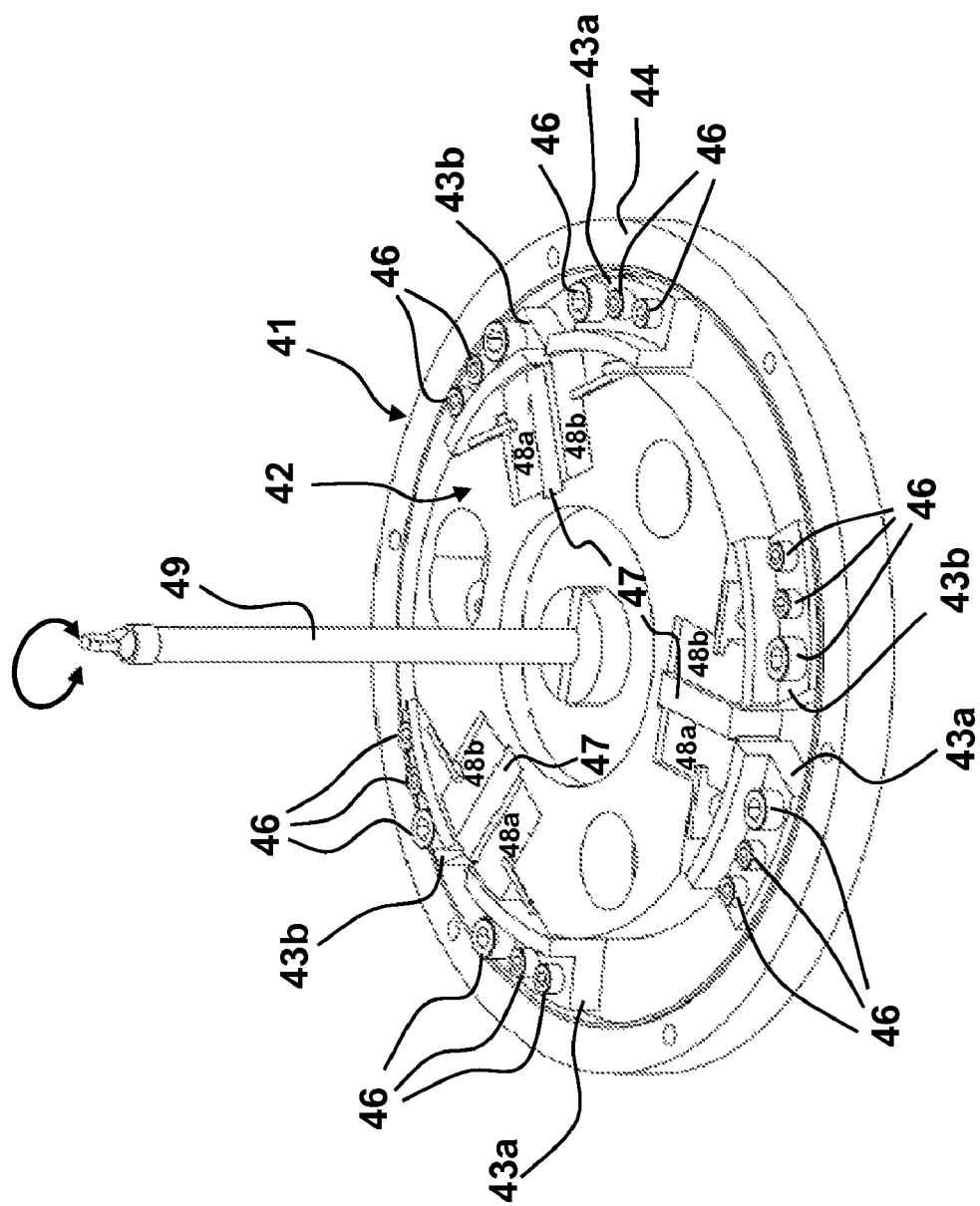
FIG. 5 is an isometric view of a magnetic latch according to the present invention.
Figure 6B:
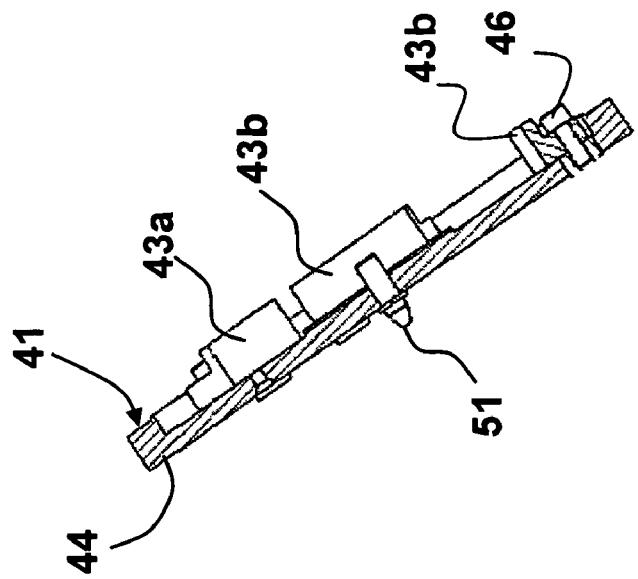
Figure 6A:
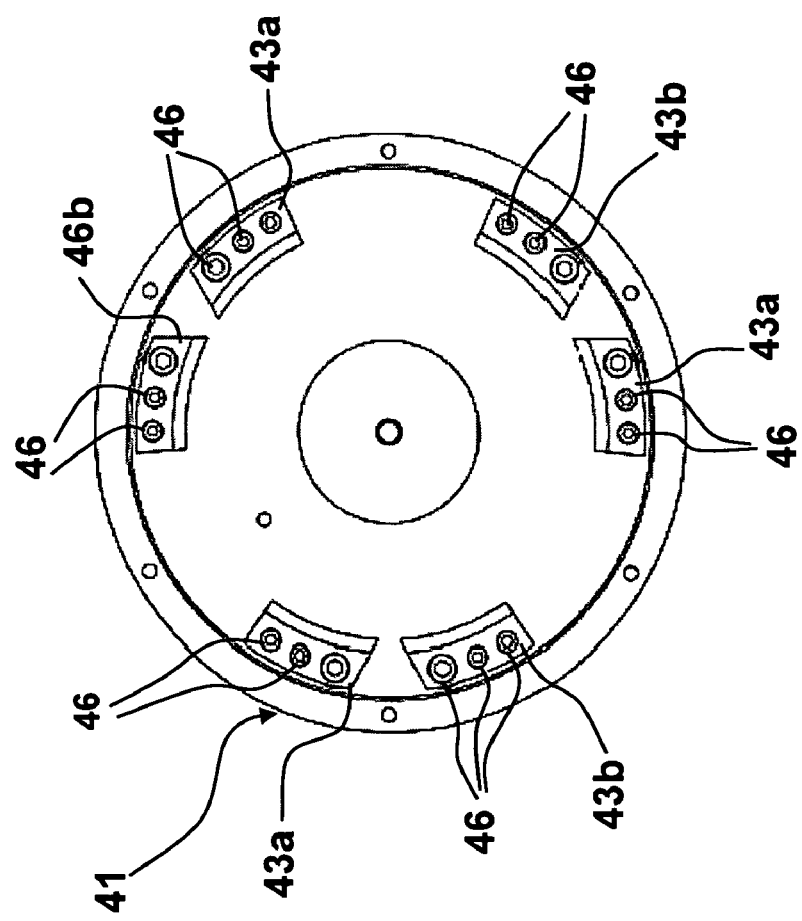
FIG. 6a is a top view of a stator of the magnetic latch of FIG. 5.
Figure 7:
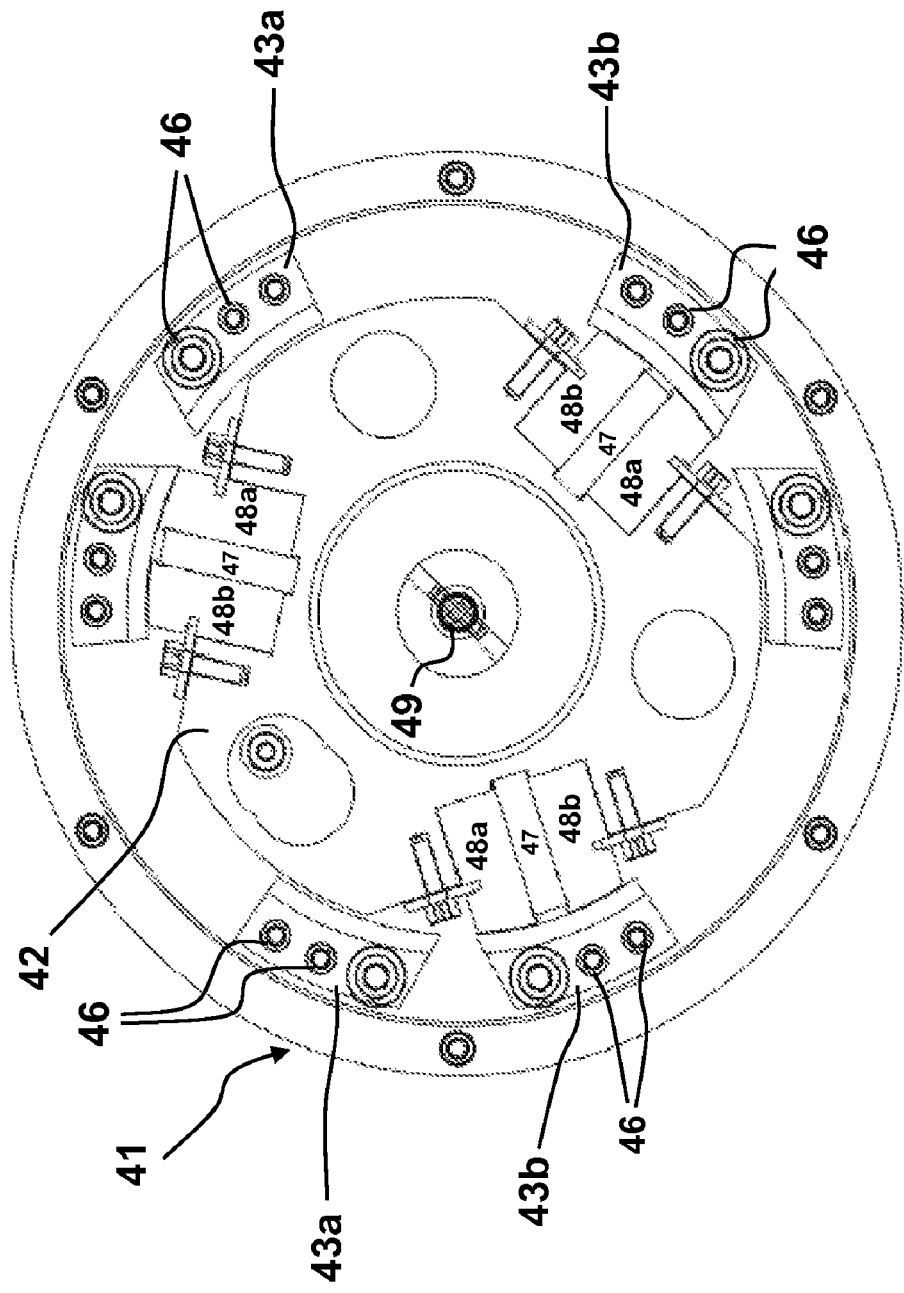
FIG. 7 is a top view of the magnetic latch of FIG. 5 in the unlatched position.

The basic principle behind the magnetic latch 18 is illustrated in FIG. 4a to 4c, in which a permanent magnet 31 is disposed in an unlatched position (FIGS. 4a and 4b) or a latched position (FIG. 4c). In FIG. 4a, a magnetic circuit, indicated by arrow 32, is completed through a bypass section 33 leaving poles 34a and 34b non-magnetized. In FIG. 4b, the substrate holder 23 is brought in contact with the poles 34a and 34b providing an alternative magnetic circuit. To complete the alternative magnetic circuit, indicated by arrow 36 in FIG. 4c, the permanent magnet 31 is rotated into alignment with the poles 34a and 34b, thereby ensuring that the substrate holder 23 is magnetically attracted by the poles 34a and 34b. Alternatively, the permanent magnet 31 can remain fixed, while the bypass section 33 and the poles 34a and 34b are moved into and out of alignment therewith.

A preferred embodiment of the magnetic latch 18, illustrated in FIGS. 5, 6a, 6b and 7, includes a cylindrical stator 41, with a cylindrical rotor 42 rotatable thereon. The stator 41 includes three sets of stator poles 43a and 43b fixed to a base 44 by a plurality of mechanical fasteners, e.g. hex bolts 46, ensuring good contact. The rotor 42 includes three radially extending permanent magnets 47 sandwiched between rotor poles 48a and 48b. The north and south poles of the permanent magnets extend along the long sides thereof adjacent to the rotor poles 48a and 48b, respectively. Each magnetic latch 18 includes an elongated actuator 49 extending down through the main platform 16 and each spindle 17 for rotating the rotors 42 between the latched position (FIG. 5) and the unlatched position (FIG. 7) from outside of the process chamber 2. The actuator 49 includes a tongue or other engageable feature on the upper end thereof for engagement by another mechanical device, e.g. a shaft 50 (FIG. 3), above the planetary substrate support. In the unlatched position both of the rotor poles 48a and 48b are rotated adjacent to one of the stator poles 43b, thereby shorting the permanent magnet 47, breaking the magnetic circuit through the stator 41, and releasing the substrate holder 23.

To facilitate alignment of the substrate holder 23 with the stator 41, a tapered pin 51 is provided extending from the center of the base 44. A single tapered pin 51 in the center of the base 44 provides an alignment feature, which ensures the proper alignment of the substrate holder 23 without dictating the exact angular orientation thereof. Tapered pins can be positioned at other positions around the circumference of the stator or other radial positions.

Examples of substrate holders 23 are illustrated in FIGS. 8a to 8d. The substrate holder 23a, in FIG. 8a, includes a base 53 fastened to an annular cover 54, which includes an annular shoulder 56 for supporting a single substrate 57. A cylindrical recess 55 is provided in the base 53 for receiving the tapered pin 51, thereby providing a mating alignment feature therefor. The base 53 if formed entirely or at least partially of a material that is attracted by the magnetic latch 18, e.g. a ferromagnetic material including one or more of iron, cobalt and nickel. The base 53 also provides a protective cover for the uncoated side of the substrate 57, thereby preventing unintentional and unwanted back coating. Substrate holder 23b (FIG. 8b) includes a multi-disk annular cover 58 fastened to the base 53. The multi-disk cover 58 includes a plurality of annular shoulders 59 for supporting a plurality of smaller substrates 61. For odd shaped substrates, such as prisms 62, a multi-prism cover 63 is provided for mounting to the base 53, see FIG. 8c.

Figure 8C:
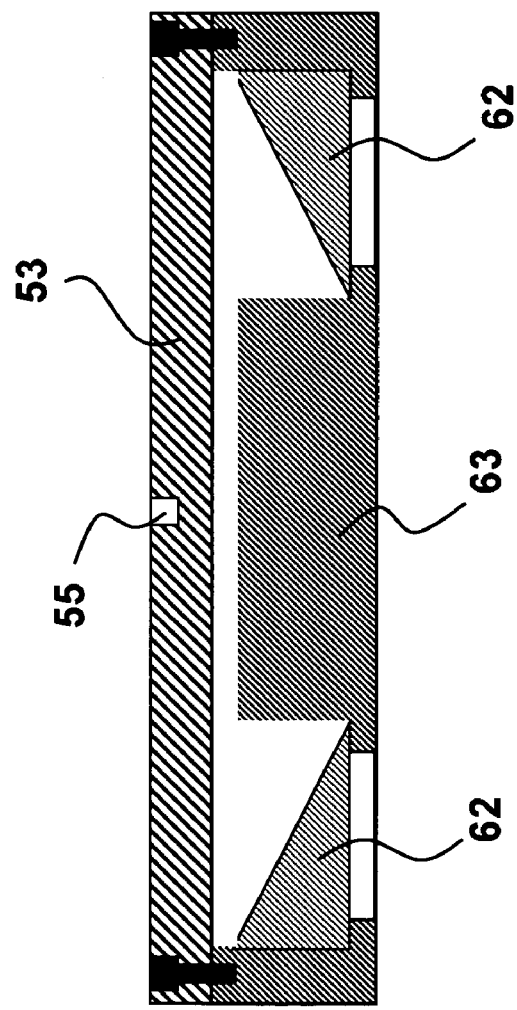
Figure 8D:
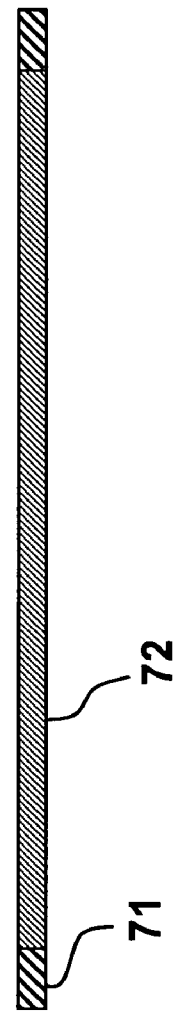

As an alternative to the base 53, a ferromagnetic ring 71, for attraction to the stator 41, surrounds a substrate 72 (FIG. 8d). An advantage to the ring 71 is the ability to coat the substrate 72 with the same or different coatings on opposite sides thereof without removing it from the ring 71. Moreover, the substrate 72 and ring 71 need not be removed from the process chamber 1, between coatings, e.g. simply flipped over by the robotic arm 7.

A typical substrate would be a glass wafer 200 mm in diameter and 0.7 mm to 1.4 mm thick; however, other substrate forms are possible, e.g. up to 32 mm in thickness and a mass of up to 2 kg.

We claim:

1. A planetary substrate support for mounting in a process chamber of a coating system, which is for coating substrates mounted on substrate holders, comprising:
   a process chamber;
   a main support, located within the process chamber, rotatable about a first axis;
   a plurality of spindles extending from the main support, located within the process chamber, rotatable about respective spindle axes which are different axes than the first axis;
   a magnetic latch on an end of each spindle, each magnetic latch located within the process chamber and including a permanent magnet and a mounting surface;
   a plurality of substrate holders selectively connectable and disconnectable to the mounting surfaces of the magnetic latches;
   wherein each magnetic latch is configured to selectively magnetically connect and disconnect one of the substrate holders to its mounting surface, and wherein each magnetic latch is configured to be operable such that each magnetic latch magnetizes and demagnetizes its respective mounting surface; and
   wherein each magnetic latch includes a first section, and a second section movable relative to the first section between a first position in which the permanent magnet forms a magnetic circuit with poles on the first and second sections, which magnetizes the mounting surface for attracting one of the substrate holders, and a second position in which the magnet circuit is short circuited and the mounting surface is demagnetized, thereby to release one of the substrate holders from the magnetic latch and enabling the substrate and substrate holder to be removed from the magnetic latch and the process chamber.

2. The planetary substrate support according to claim 1, wherein each of the first sections comprises a stator including the mounting surface, and poles for aligning with the permanent magnet; and
   wherein each of the second sections comprises a rotor, including the permanent magnet for rotation between the first position in which the permanent magnet is aligned with the poles of the stator, and the second position in which the permanent magnet is not aligned with the poles of the stator, thereby making the stator non-magnetic.

3. The planetary substrate support according to claim 1, wherein each magnetic latch further comprises an actuator extending through the main support and the spindle for moving the second section relative to the first section from outside the process chamber.

4. The planetary substrate support according to claim 2, wherein each rotor includes a plurality of permanent magnets; and each stator includes a plurality of poles for aligning with the plurality of permanent magnets.

5. The planetary substrate support according to claim 4, wherein each rotor includes a rotor pole on each side of each permanent magnet for aligning with respective stator poles, which forms a magnetic circuit through the mounting surface when in the first position, and for engaging a single stator pole, which shorts the permanent magnet when in the second position.

6. The planetary substrate support according to claim 1, further comprising a substrate holder for supporting the substrate including a ferromagnetic portion for attraction by the magnetic latch.

7. The planetary substrate support according to claim 6, wherein the substrate holder includes a first aligning feature; and wherein each magnetic latch includes a second aligning feature for engaging the first aligning feature.

8. The planetary substrate support according to claim 7, wherein the first and second aligning features are in the center of the substrate holder and each magnetic latch, respectively.

9. The planetary substrate support according to claim 6, wherein the substrate holder comprises an annular ring surrounding the substrate.

10. The planetary substrate support according to claim 1, wherein each magnetic latch is for suspending a substrate holder above a coating source.

* * * * *